(12) United States Patent
Kang et al.

(10) Patent No.: US 8,897,020 B2
(45) Date of Patent: Nov. 25, 2014

(54) INTEGRAL CABLE GUIDE FOR ELECTRONIC MODULE

(75) Inventors: Soon Seng Kang, Singapore (SG); Xiaofan Chen, Singapore (SG)

(73) Assignee: Rockwell Automation Asia Pacific Business Center Pte. Ltd., Singapore (SG)

(*) Notice: Subject to any disclaimer, the term of this patent is extended or adjusted under 35 U.S.C. 154(b) by 476 days.

(21) Appl. No.: 13/222,411

(22) Filed: Aug. 31, 2011

(65) Prior Publication Data
US 2012/0057307 A1  Mar. 8, 2012

(30) Foreign Application Priority Data
Sep. 1, 2010  (SG) .................................. 201006353

(51) Int. Cl.
*H05K 5/00* (2006.01)
(52) U.S. Cl.
USPC ............................................................ 361/730
(58) Field of Classification Search
USPC ............................................................ 361/730
See application file for complete search history.

(56) References Cited

U.S. PATENT DOCUMENTS

| | | | |
|---|---|---|---|
| 4,174,877 A * | 11/1979 | Foederer | 439/425 |
| 4,866,215 A | 9/1989 | Muller et al. | |
| 5,037,310 A | 8/1991 | Marinello | |
| 5,313,372 A | 5/1994 | Chabert et al. | |
| 5,615,079 A | 3/1997 | Eggert et al. | |
| 6,320,131 B1 * | 11/2001 | McCann | 174/69 |
| 6,546,181 B1 * | 4/2003 | Adapathya et al. | 385/135 |
| 6,679,722 B1 | 1/2004 | Pulizzi | |
| 7,568,924 B2 * | 8/2009 | Kinsey, Jr. | 439/157 |
| 7,622,673 B2 * | 11/2009 | Quijano | 174/50 |
| 7,916,489 B2 * | 3/2011 | Okuya | 361/752 |
| 8,064,209 B2 * | 11/2011 | Masucci et al. | 361/752 |
| 8,243,402 B2 * | 8/2012 | Benoit et al. | 361/42 |
| 8,575,483 B2 * | 11/2013 | Gauthier | 174/58 |
| 2008/0305673 A1 | 12/2008 | Kinsey, Jr. | |
| 2009/0197461 A1 | 8/2009 | Benoit et al. | |
| 2010/0288526 A1 * | 11/2010 | Meyer | 174/58 |

FOREIGN PATENT DOCUMENTS

| | | |
|---|---|---|
| CN | 101646987 A | 2/2010 |
| EP | 0 795 935 A2 | 9/1997 |

OTHER PUBLICATIONS

Singapore Application No. 201006353-5 Written Opinion dated May 25, 2012; 7 pgs.
Chinese Patent No. 201110265730.3, 1st Office Action dated May 21, 2014, 6 pgs.

* cited by examiner

*Primary Examiner* — Forrest M Phillips
(74) *Attorney, Agent, or Firm* — Fletcher Yoder. P.C.

(57) ABSTRACT

An integral cable guide for an electronic module is provided. The electronic module includes a top housing with a ridge formed on one side. The top housing is configured to removably couple with a bottom housing to enclose electronic components. The electronic module further includes a receptacle within the top housing configured to receive a removable terminal block (RTB), such that a channel is formed between the ridge and the RTB when the RTB is placed within the receptacle. The channel guides cables coupled to the RTB to an outside edge of the module. The electronic module further includes at least one anchor that provides support for the cables.

21 Claims, 6 Drawing Sheets

US 8,897,020 B2

INTEGRAL CABLE GUIDE FOR ELECTRONIC MODULE

CROSS REFERENCE TO RELATED APPLICATIONS

This application claims priority from and the benefit of Singapore Patent Application No. 201006353-5, filed on Sep. 1, 2010; entitled "Integral Cable Guide for Electronic Module", which is herein incorporated by reference.

BACKGROUND

The invention relates generally to industrial automation and control systems. More particularly, embodiments of the present invention relate to techniques for providing an integral cable guide for electronic modules used in industrial automation and control systems.

Industrial automation and control systems are known and are in use for controlling factory automation and the like. Such systems include various components or electronic modules such as programmable logic controllers, semiconductor power electronic circuits, power supplies, motor starters, relays, and so forth that are utilized to monitor and control a process/system. For example, in a typical industrial control system, a programmable logic controller examines a series of inputs reflecting the status of a controlled process and changes outputs affecting control of the controlled process. The programmable logic controller typically receives data from various system components (e.g., sensors) and provides commands to other system components (e.g., actuators).

As indicated above, some electronic modules employed in industrial automation and control systems operate to transfer input and output signals to and from various components of the system. To facilitate such transfer of data, traditional electronic modules typically utilize removable terminal blocks (RTBs). An RTB typically includes a series of terminals arranged on a body that includes a connector for communicatively coupling with a functional component (e.g., a printed circuit board) of an electronic module. The connector transfers data between the terminals and the functional component, thus, providing data to the functional component from the wiring coupled with the terminals. The terminals of the RTB enable a technician to quickly couple and decouple wiring for data transmission to and from the electronic module. Indeed, RTBs are usually used to connect wiring among various devices within a control system. For example, an RTB may couple a programmable logic controller and/or an input/output (I/O) module with various sensors and actuators such that data can be efficiently accumulated and instructions can be efficiently issued via wiring coupled to the terminals of the RTB. Each RTB may have several cables of varying sizes that may be utilized for different devices within the control system.

Depending on the number of terminals on a particular RTB, a large number of wires may be coupled to the RTB. It is now recognized that this accumulation of wiring coupled to the RTB can be an inconvenience to a user. For example, it is now recognized that the wiring can become unwieldy and/or impede the view of certain aspects of the associated electronic module.

BRIEF DESCRIPTION

Briefly, according to one aspect of the invention, an electronic module is provided. The electronic module includes a top housing comprising a ridge formed on one side of the top housing. The top housing is configured to removably couple with a bottom housing to enclose electronic components. The electronic module further includes a receptacle within the top housing configured to receive a removable terminal block (RTB), such that a channel is formed between the ridge and the RTB when the RTB is placed within the receptacle.

In another embodiment, an electronic system is provided. The electronic module includes a top housing of an electronic module comprising a ridge extending from one side of the top housing and a plurality of receptacles within the top housing. A first removable terminal block (RTB) is positioned within a first receptacle of the plurality of receptacles such that a first channel is formed between the first RTB and the ridge. The first RTB is configured to communicatively couple with a first plurality of cables and the first channel is configured to guide the first plurality cables away from the first RTB to an edge of the electronic module. A second RTB is positioned within a second receptacle of the plurality of receptacles such that a second channel is formed between the first RTB and the second RTB. The first RTB is configured to communicatively couple with a second plurality of cables and the second channel is configured to guide the second plurality of cables away from the second RTB to the edge of the electronic module. The electronic module further includes a bottom housing configured to be removably attached to the top housing and a plurality of anchors respectively aligned with the first and second channels to facilitate support of the first and second plurality of cables.

In another embodiment, a method for providing electrical coupling is provided. The method includes receiving a removable terminal block (RTB) into a receptacle of a top housing of an electronic module such that a channel is formed between a ridge of the top housing and a feature of the RTB, receiving a distal end of a cable into an attachment feature of the RTB and retaining the cable and guiding the cable away from the electronic module via the channel.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
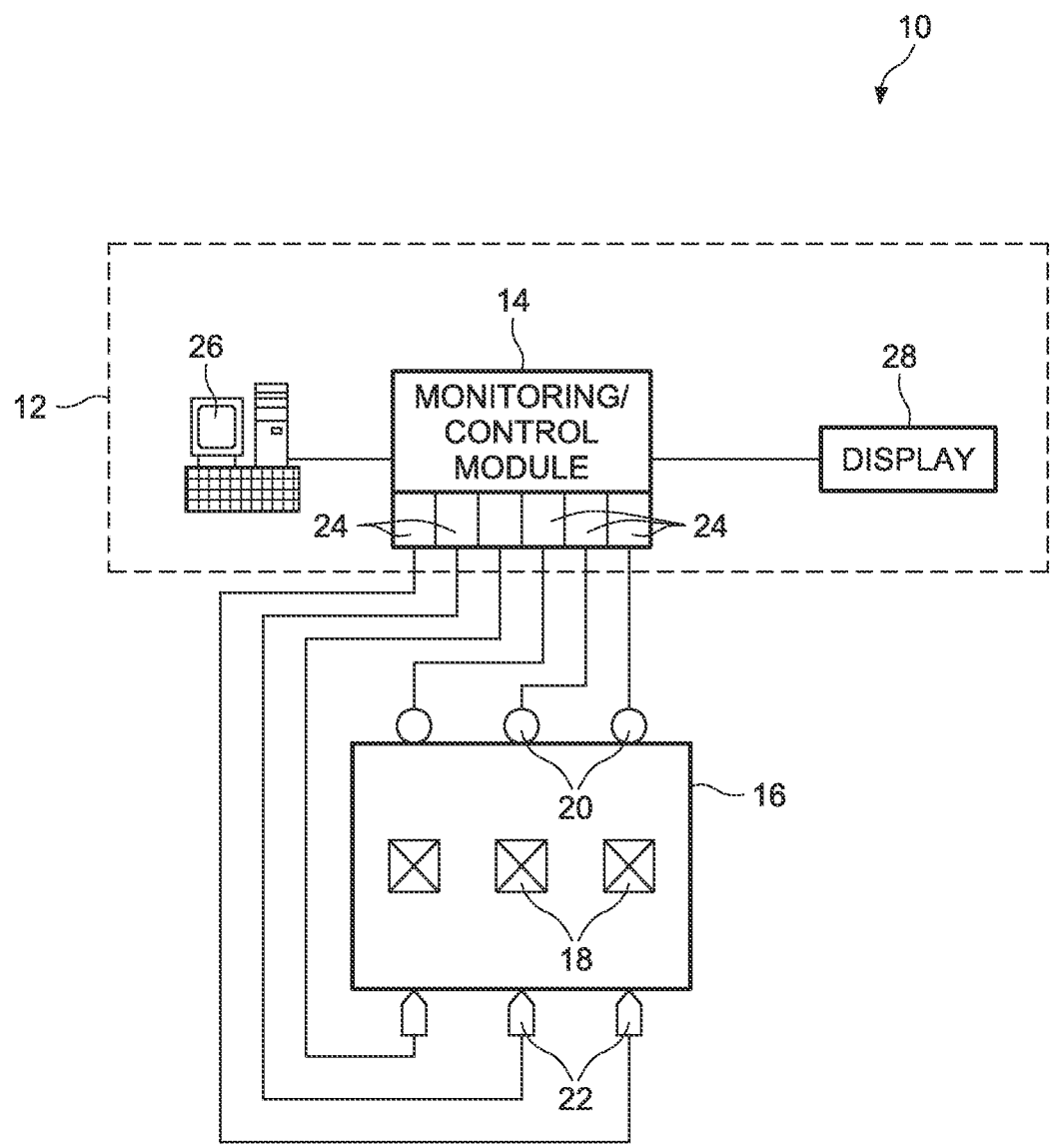
FIG. 1 is a block diagram that illustrates an exemplary industrial automation and control system including a module in accordance with aspects of the present technique.

In typical automation systems, several electronic modules are often employed in communication with one another. At least a portion of such electronic modules include removable terminal blocks (RTBs) that facilitate communicative coupling with various other electronic components within the automation system. Typically, the RTBs associated with these electronic modules are coupled to other electronic components in the system using several cables. However, it is now recognized that coupling these cables to a traditional RTB can be generally obstructive and inconvenient to users. For example, the cables sometimes block indicators (e.g., light emitting diodes indicative of status) present on the face of the associated electronic module. Accordingly, it is now recognized that it is desirable to develop a design for the electronic module and the RTB that can guide the cables away from the modules in a way that does not obstruct the view of the indicators on the module.

As discussed in detail below, embodiments of the present technique function to provide a cable or wiring guide for electronic modules. For example, present embodiments include channels formed on the electronic module in a manner that allows the cables to be guided away from the module in an organized fashion. Specifically, a ridge formed on a body of the electronic module cooperates with an RTB to provide a groove in which the wiring can be arranged, and status indicators may be provided on a face of the groove such that they remain clearly visible and unblocked by the wiring. In some embodiments, multiple RTBs may form grooves between one another. For example, a high ridge on the back of a first RTB may form a groove with the lower front portion of another RTB arranged in parallel. Further, present embodiments include integral anchors that can be used to provide support to the cables. For example, the anchors enable bundling and coupling of the wiring directly to the body of the electronic module in a manner that maintains the arrangement of the wiring in the groove. Further, fasteners may be used to fasten the cables to the anchors, and the anchors may include or cooperate with features configured to facilitate directing the fasteners around portions of the anchors such that a technician can easily guide the fastener around the anchors and the bundled wiring.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Turning now to the drawings and referring first to FIG. 1, an exemplary industrial automation and control system 10 is illustrated. The system 10 includes an enclosure 12, such as an electrical cabinet, in which electrical components such as monitoring and/or control components are housed. Example components in the unit may include relays, motor starters, and programmable logic controllers (PLC), among others.

The enclosure 12 may be suitable, for example, for assembly of a motor control center or use with industrial, commercial, marine, or other electrical systems. The enclosure 12 may be made of any suitable material, such as heavy gage sheet metal, reinforced plastics, and so forth. In certain embodiments, the enclosure 12 includes individual compartments or other structures that support the electrical components.

In the illustrated embodiment, the system 10 includes a monitoring/control module 14 assembled in accordance with present techniques and adapted to interface with components of a machine system/process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process/system 16 may take many forms and include devices for accomplishing many different and varied purposes. For example, the process/system 16 may comprise a compressor station, an oil refinery, a batch operation for making food items, a mechanized assembly line, and so forth. Accordingly, the process/system 16 may comprise a variety of operational components generally represented by reference numeral 18, such as electric motors, valves, actuators, temperature elements, pressure sensors, or a myriad of manufacturing, processing, material handling and other applications.

Further, the process/system 16 may comprise control and monitoring equipment for regulating process variables through automation and/or observation. For example, the illustrated process/system 16 comprises sensors 20 and actuators 22. The sensors 20 may comprise any number of devices adapted to provide information regarding process conditions. The actuators 22 may include any number of devices adapted to perform a mechanical action in response to an input signal.

As illustrated, these sensors 20 and actuators 22 are in communication with the monitoring/control module 14 (e.g., a programmable logic controller). In one embodiment, the sensors 20 and actuators 22 may communicate with the monitoring/control module 14 via one or more electronic modules 24 coupled to the monitoring/control module 14. The electronic modules 24 may transfer input and output signals between the monitoring/control module 14 and the controlled process/system 16.

In certain embodiments, these devices (sensors 20 and actuators 22) may be utilized to operate process equipment. Indeed, they may be utilized within process loops that are monitored and controlled by the process/system 16. Such a process loop may be activated based on process inputs (e.g., input from a sensor 20) or direct operator input received through a user interface device 26.

The electronic modules 24 may be integrated with the control/monitoring device 14, or may be added or removed via expansion slots, bays or other suitable mechanism. For example, to add functionality to the control/monitoring device 14, additional electronic modules 24 may be added, such as if new sensors 20 or actuators 22 are added to control the process/system 16. These electronic modules serve as an electrical interface to the controller and may be located proximate or remote from the controller including remote network interfaces to associated systems.

The electronic modules 24 may include input modules that receive signals from input devices such as photo-sensors and proximity switches, output modules that use output signals to energize relays or to start motors, and bidirectional electronic modules, such as motion control modules which can direct motion devices and receive position or speed feedback. In some embodiments, the electronic modules 24 may convert between AC and DC analog signals used by devices on a controlled machine or process and +5-volt DC logic signals used by the controller. Additionally, some of the electronic modules 24 may provide digital signals to digital electronic devices and receive digital signals from digital electronic devices. Further, in some embodiments, the electronic modules 24 that are used to control motion devices or process control devices may include local micro-computing capability on the electronic module 24.

In some embodiments, the electronic modules 24 may be located in close proximity to a portion of the control equipment, and away from the remainder of the controller. Data is communicated with remote modules over a common communication link, or network, wherein modules on the network communicate via a standard communications protocol. Many industrial controllers can communicate via network technologies such as Ethernet (e.g., IEEE802.3, TCP/IP, UDP, Ether-Net/IP, and so forth), ControlNet, DeviceNet, or other network protocols (Foundation Fieldbus (H1 and Fast Ethernet) Modbus TCP, Profibus) and can also communicate to higher level computing systems.

In the illustrated embodiment, the system 10 also includes a display 28 such as an LCD or other display. The display 28 is configured to display output parameters such as operating parameters of the process/system 10, temperature and pressures sensed by the sensors 20, position information of the actuators 22 and so forth.

Figure 2:
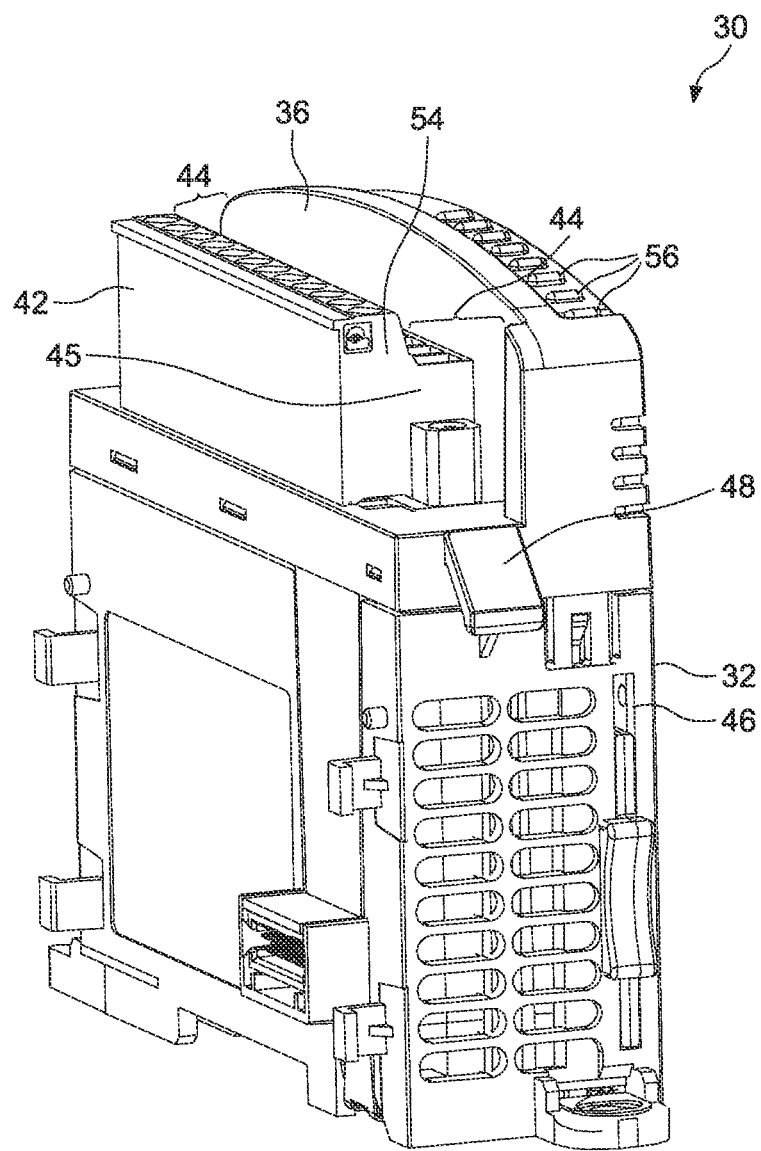
FIG. 2 illustrates a perspective view of an assembled individual module in accordance with aspects of the present technique.
Figure 3:
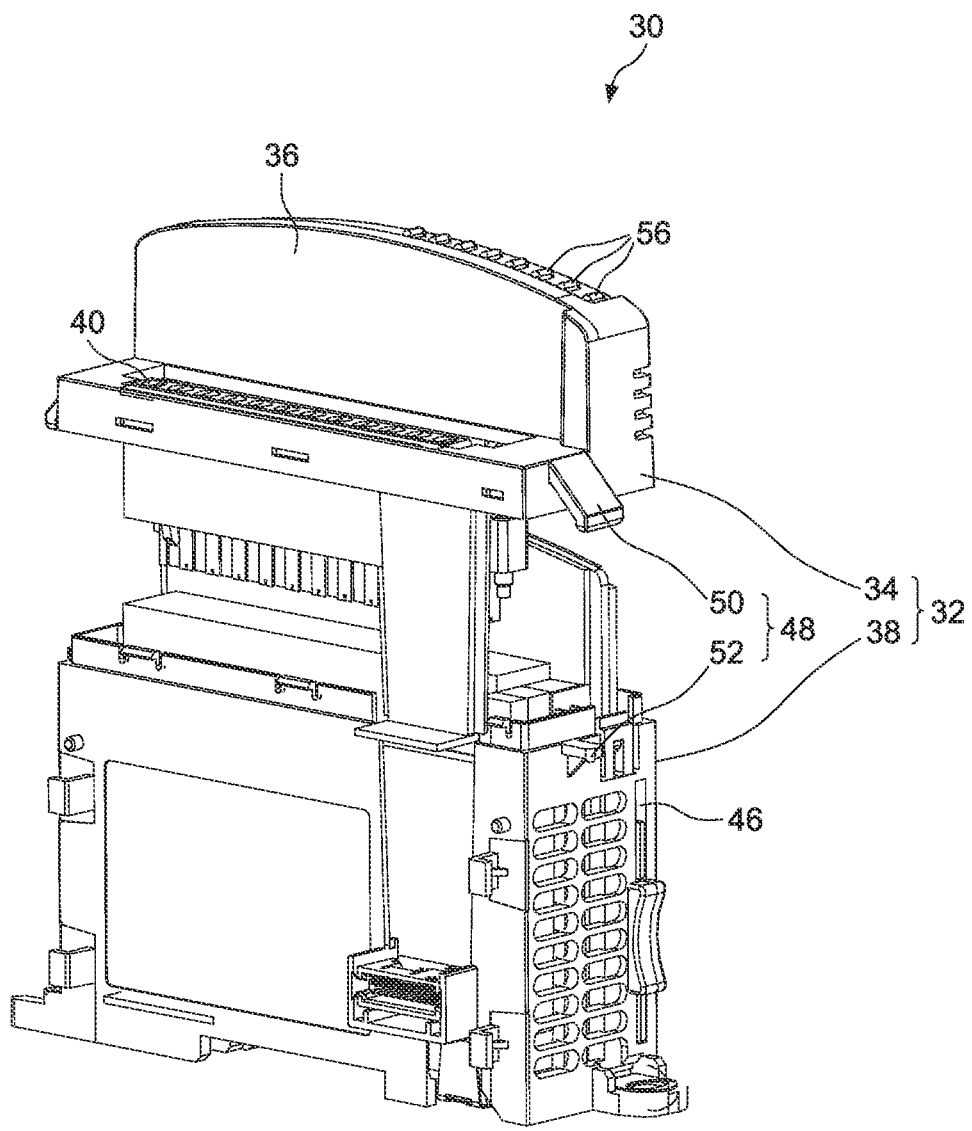
FIG. 3 is another perspective view of the module of FIG. 2 with portions of the module removed to illustrate components disposed within the module in accordance with aspects of the present technique.

FIGS. 2 and 3 illustrate perspective views of an electronic module 30 in accordance with present embodiments. The electronic module 30 may be representative of the monitoring/control module 14 of FIG. 1 or a related electronic module. Specifically, FIG. 2 illustrates a perspective view of the electronic module 30 in an assembled condition, while FIG. 3 provides a view of the module 30 from a different perspective with portions of the module 30 removed to illustrate certain components disposed within the module 30. As illustrated in FIGS. 2 and 3, the electronic module 30 includes a device housing 32 configured to hold various components such as printed circuit boards, a removable terminal block, and the like.

As can be seen in FIG. 3, the device housing 32 includes a top housing 34 and a bottom housing 38 that couple together to form the device housing 32. Indeed, the top housing 34 is configured to removably couple with the bottom housing 38 to facilitate access to components disposed within the device housing 32. Further, the top housing 34 includes a ridge 36 formed on one side. In the illustrated embodiment, the ridge 36 houses one or more indicators or light guides 56 configured to provide visual status indications related to the electronic module. The indicators 56 are positioned on a face of the ridge 36 to provide visibility and couple with features (e.g., wiring or light piping) disposed within the ridge 36. The indicators 56 may include light emitting devices (e.g., light emitting diodes) that are configured to be activated by a functional component of the electronic module 30 to provide certain status indications (e.g., a power indication, an error indication, and/or a warning alarm). The light emitting devices may be coupled to light piping that is at least partially disposed within the ridge 36 and that transmits the light to the indicators 56 on the face of the ridge 36. In other embodiments, the light emitting devices may be housed near the face of the ridge 36 and couple with the functional component of the electronic module 30 via wiring.

The top housing further includes a receptacle 40 (as illustrated in FIG. 3) adapted to receive a removable terminal block (RTB) 42 (as illustrated in FIG. 2). As illustrated in FIG. 2, the RTB 42 is shaped and positioned on the electronic module 30 such that a channel 44 is formed between the ridge 36 and certain aspects of the RTB 42 when the RTB 42 is placed within the receptacle 40. More specifically, the RTB 42 comprises a raised side 54 that forms the channel 44 with the ridge 36 over a lower side 45 of the RTB 42.

The electronic module 30 further includes an anchor 48 which is configured to provide support for one or more cables that are coupled to the RTB 42 and that extend along and out of the channel 44. In one embodiment, the cables are fastened to the anchor 48 using a fastener such as a cable tie. As illustrated in FIG. 3, the anchor 48 includes a top portion and a bottom portion. Specifically, the top portion of the anchor 48 comprises a tab 50 that is substantially aligned with a length of the channel. In the illustrated embodiment, the tab 50 is substantially aligned with a length of the channel 44 and angled down relative to a face of the channel 40. In other embodiments, the tab 50 is flat or angled up with respect to the face of the channel 44.

The bottom portion of the anchor 48 comprises a base support 52. The base support 52 facilitates transitioning a fastener, such as a cable tie, underneath the tab 50 such that a technician can easily couple cables or wiring to the anchor 48. In some embodiments, the base support 52 may be shaped such that it guides the fastener upwards as is passes underneath the tab 50. This may enable a technician to easily grasp the end of the fastener as is passes from underneath the tab 50. In other embodiments, a wedge guide may be used to in conjunction with the anchor 48 to facilitate coupling of a fastener to the anchor 48, as will be discussed below. In one embodiment, the tab 50 is formed on the top housing 34 of the electronic module 30 and the base support 52 is formed on the bottom housing 38 of the electronic module 30. In the illustrated embodiment, the tab 50 and the base support 52 are each cantilevered from the device housing 32. It should be noted, however, that the anchor 50 can also be removably attached to electronic modules in accordance with present embodiments.

The above described embodiment of the electronic module 30 is adapted to be used with a single RTB 42. However, embodiments of the present technique include electronic modules that are adapted for use with multiple RTBs and associated components (e.g., anchors). For example, an electronic module 60 adapted for use with two RTBs 72 and 74 is described in further detail below.

Figure 4:
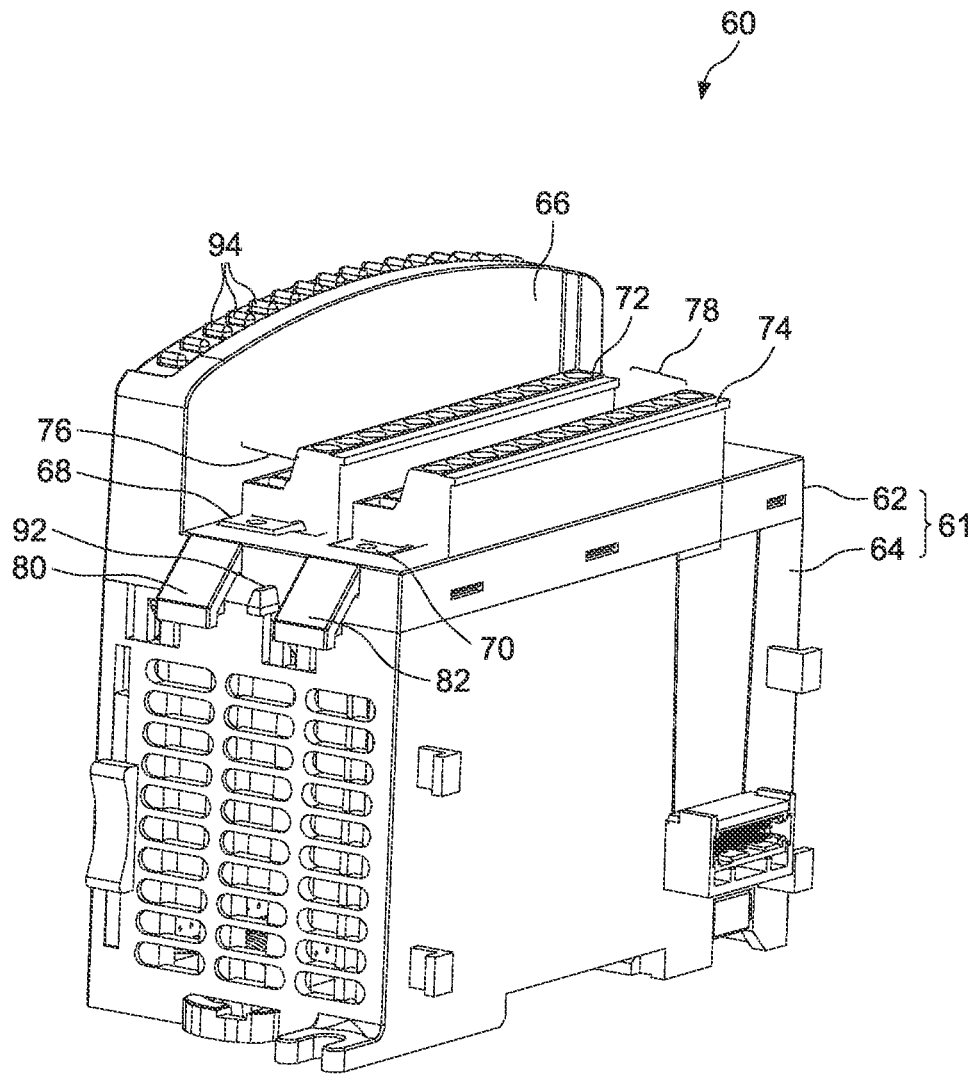
FIG. 4 illustrates a perspective view of an assembled electronic module that employs two removable terminal blocks in accordance with aspects of the present technique.
Figure 5:
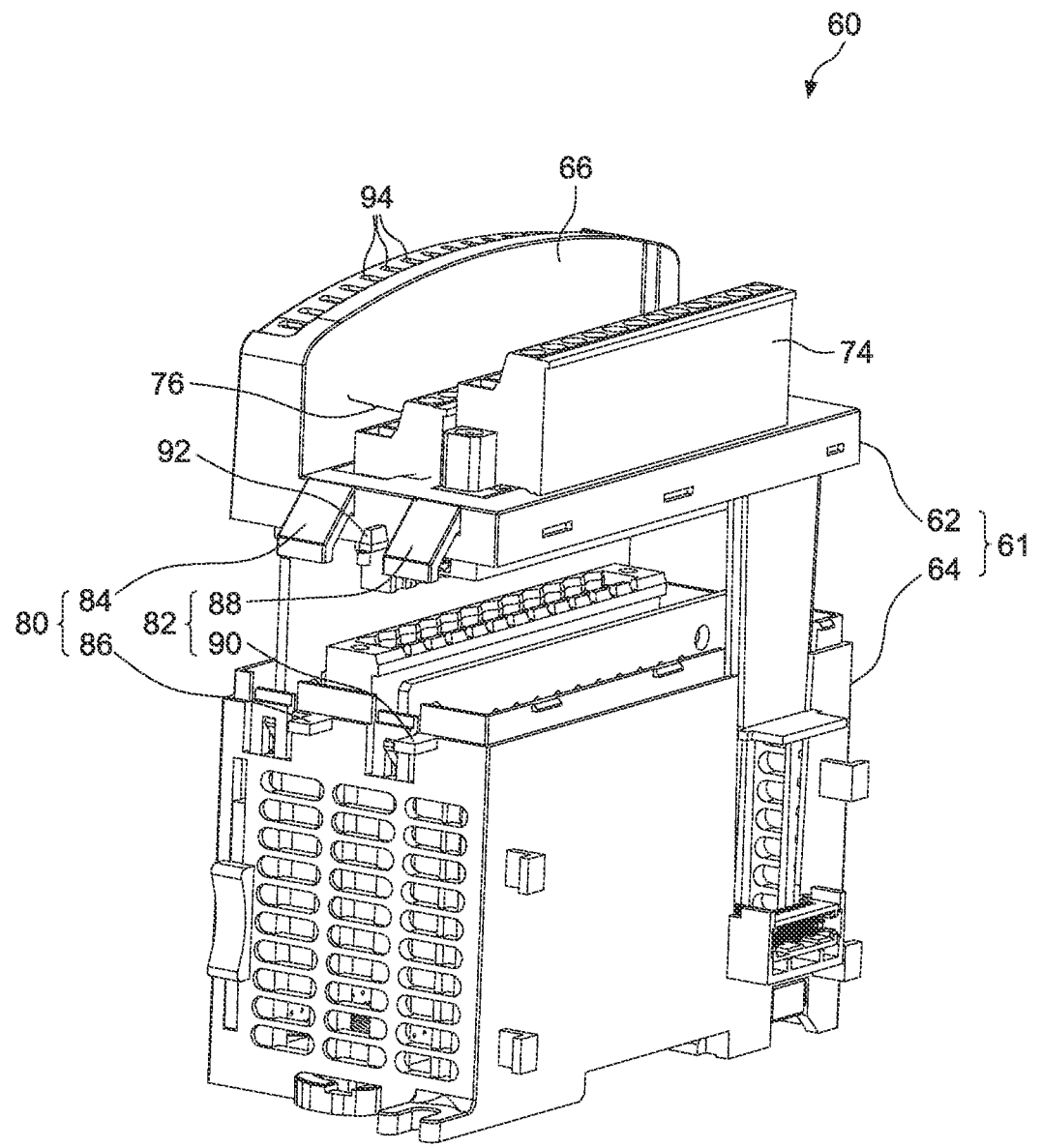
FIG. 5 is another perspective view of the module of FIG. 4 with portions of the module removed to illustrate components disposed within the module in accordance with aspects of the present technique.

FIG. 4 illustrates an assembled perspective view of an electronic module 60 that employs two RTBs 72 and 74. Similarly, FIG. 5 is a view of the module 60 from a different perspective with portions of the module 60 removed to illustrate certain components disposed within the electronic module 60. The electronic module 60 includes a module housing 61 that includes a top housing 62 and a bottom housing 64. The bottom housing 62 is adapted to be removably attached to the top housing 62 to facilitate access to components disposed within the electronic module 60. The top housing 62 includes a ridge 66 extending from one side of the top housing 62 and along a length of the top housing 62. The top housing 62 further includes receptacles 68 and 70 coupled with RTBs 72 and 74. Indeed, the RTBs 72 and 74 are positioned within receptacles 68 and 70, respectively. The RTBs 72 and 74 are configured to communicatively couple with functional components of the electronic module 60 and include terminals that facilitate communicative coupling with other electronic components using multiple cables that attach to the terminals.

When the RTBs 72 and 74 are placed within the respective receptacles 68 and 70, a pair of channels are formed. Specifically, a first channel 76 is formed between RTB 72 and the ridge 66. Similarly, a second channel 78 is formed between RTB 72 and RTB 74. Specifically, raised portions of the RTBs 72 and 74 form the second channel 78 over the lower portion of the RTB 74. Each of these channels 76 and 78 facilitate guiding and organization of wiring or cables disposed along the upper portion of the module 60 and coupled to the RTBs 72 and 74. The first and second channels are configured to guide the cables coupled to the RTBs 72 and 74 away from the terminals of RTBs 72 and 74 and to an edge of the electronic module 60. It should be noted that FIG. 5 may be considered to illustrate an embodiment wherein the RTB 74 is taller than the RTB 72 and cooperates to define a single large and sloping channel between the ridge 66 and the RTBs 72 and 74.

The electronic module 60 also includes anchors 80 and 82, which are respectively aligned with the channels 76 and 78. The anchors 80 and 82 are configured to provide support to cables coupled to the RTBs 72 and 74. Specifically, the anchors 80 and 82 facilitate coupling of the cables to the module housing 61. In one embodiment, the cables or wiring coupled to the RTBs 72 and 74 may be gathered near the edge of the channels 76 and 78. Further, the cables or wiring may be fastened to the anchors 80 and 82 using one or more fasteners such as cable ties. In the illustrated embodiment, each of the anchors 80 and 82 includes a top portion or tab 84 and 88, respectively. Further, the anchors 80 and 82 each include a bottom portion or base support 86 and 90, respectively. In one embodiment, the tabs 84 and 88 of the anchors 80 and 82 are cantilevered from the top housing 62, and the base supports 86 and 90 are cantilevered from the bottom housing 64. The anchors 80 and 82 may be integral with the module housing 61 or attached to the module housing 61 via a fastener (e.g., a screw or adhesive).

The electronic module further includes a wedge guide 92. The wedge guide 92 is adapted to guide a fastener (e.g., a cable tie) up through a space formed between the anchors 80 and 82 after passing underneath a one of the tabs 84 and 86. Specifically, the wedge guide 92 includes angled sides that are positioned relative to the base supports 86 and 90 such that an end of a fastener sliding over the base supports 86 and 90 will be directed upward. This enables a technician to readily grasp an end of the fastener as is passes under a respective one of the tabs 84 and 86, which facilitates quick installation and securing of the wires. In the illustrated embodiment, the same wedge guide 92 is used for both anchors 80 and 82. However, in other embodiments, multiple wedge guides 92 may be employed. Further, while the wedge guide 92 is not shown in the illustrated embodiments including a single RTB, such embodiments may also employ a wedge guide.

The electronic module 60 also includes indicators 94 disposed along the ridge 66 and configured to provide status indications of the electronic module 60. Light piping and/or light emitting devices may be disposed within the ridge 66 and coupled to functional components of the electronic module 60 to enable activation and/or deactivation of the indicators 94 depending on a status of the electronic module. For example, the indicators may be caused to flash, turn off, or emit a steady light due to a power status, a component failure, a lack of communication, or as an alarm. By including the indicators 94 on the ridge 66, the indicators 94 and related features (e.g., wiring and light piping) can be efficiently stored separate from other functional features of the electronic module 60. Further, by placing the indicators 94 on a face of the ridge 66, the indicators 94 are readily visible to a user when cabling or wiring coupled to the RTBs 72 and 74 is disposed within the corresponding channels or grooves.

Figure 6:
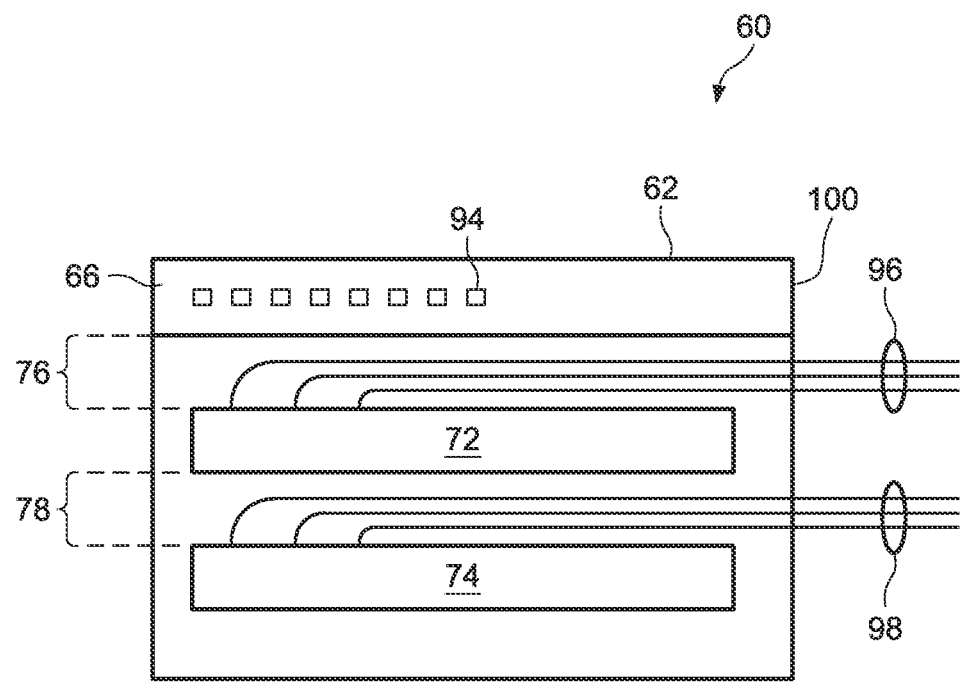
FIG. 6 is a top view of the electronic module of FIG. 4 implemented according to aspects of the present technique.

FIG. 6 is a top view of the electronic module 60 described in FIG. 5 and FIG. 6. The electronic module includes cables 96 and 98 coupled to RTBs 72 and 74 respectively. As described in detail above, channel 76 is formed between ridge 66 and RTB 72. Similarly, channel 78 is formed between RTB 72 and RTB 74. The channels thus formed guide the cables 96 and 98 to an outside edge 100 of the electronic module 60. Thus, the light guides 94 can be clearly viewed by an operator. The cables 96 and 98 may be fastened to the anchors on the electronic module as shown in FIG. 7.

Figure 7:
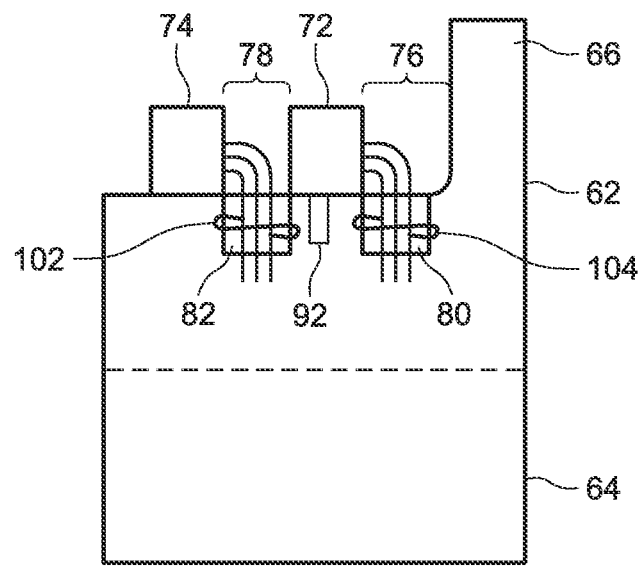
FIG. 7 is a side view of the electronic module of FIG. 4 implemented according to aspects of the present technique.

FIG. 7 is a side view of the electronic module 60 described in FIG. 5 and FIG. 6. As can be seen, the cables are guided to the edge of the electronic module via channels 76 and 78. The cables are fastened to the anchors 80 and 82 using fasteners 102 and 104 respectively. Further, wedge 92 is disposed between anchors 80 and 82 to facilitate easy movement of the fasteners.

The various aspects of the electronic module described hereinabove may be used for guiding and organizing cables of an RTB, such as those typically found in components of industrial automation and control systems. As described above, in one embodiment, the technique utilizes a channel formed between a ridge of a top housing of the electronic module and the RTB to facilitate guiding of the cables away from the module. In other embodiments, multiple channels are formed by a series of RTBs aligned with one another and with a ridge in the device housing. Advantageously, the channel or channels guide the cables away from the module so as to not block the indicators or light guides present on a top of the electronic module. For example, the indicators may be positioned on a face of the ridge, which may form an edge of a channel in which the cables are positioned. Also, the technique provides at least one anchor that provides a support to fasten the cables to the device housing a fastener (e.g., a cable tie). Additionally, a cable wedge is also provided to enable a user to easily slide a cable tie through a space formed behind the anchor and to fasten the cables on the anchor. Also, as will be appreciated by those skilled in the art, the above described implementations may be appropriately scaled and/or reinforced based upon the number of RTBs in the electronic module.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electronic module, comprising:
   a top housing comprising a ridge formed on one side of the top housing, wherein the top housing is configured to removably couple with a bottom housing to enclose electronic components; and
   a receptacle within the top housing coupled with a removable terminal block (RTB), such that a channel is formed between the ridge and the RTB, wherein the RTB comprises a raised side and the channel is formed over a lower side of the RTB.

2. The electronic module of claim 1, comprising a plurality of cables with distal ends coupled to attachment features of the RTB and lengths that pass through the channel and extend away from the RTB.

3. The electronic module of claim 1, further comprising an anchor configured to provide support for one or more cables that are coupled to the RTB and that extend along and out of the channel.

4. The electronic module of claim 3, wherein a top portion of the anchor comprises a tab that is substantially aligned with a length of the channel, and a bottom portion of the anchor comprises a wedge guide comprising an angled feature configured to guide a cable tie passed under the tab from one side of the tab such that the cable tie extends up on an opposite side of the tab.

5. The electronic module of claim 4, wherein the top portion of the anchor is formed on the top housing and the bottom portion is formed on the bottom housing.

6. The electronic module of claim 4, wherein the tab is substantially aligned with the length of the channel but angled up or down relative to a face of the channel.

7. The electronic module of claim 4, wherein the tab and the wedge guide are each cantilevered from the electronic module.

8. The electronic module of claim 4, wherein the wedge guide comprises a substantially triangular cross-section and is positioned between the tab and a second tab corresponding to a second channel formed between the RTB and a second RTB.

9. The electronic module of claim 3, wherein the anchor is removably attached to the electronic module.

10. The electronic module of claim 3, comprising the cables fastened to the anchor using a cable tie.

11. The electronic module of claim 1, wherein the ridge houses one or more light guides configured to provide visual status indications related to the electronic module through indicators on a face of the electronic module.

12. An electronic system, comprising:
a top housing of an electronic module comprising a ridge extending from one side of the top housing;
a plurality of receptacles within the top housing;
a first removable terminal block (RTB) positioned within a first receptacle of the plurality of receptacles such that a first channel is formed between the first RTB and the ridge, wherein the first RTB is configured to communicatively couple with a first plurality of cables and the first channel is configured to guide the first plurality cables away from the first RTB to an edge of the electronic module;
a second RTB positioned within a second receptacle of the plurality of receptacles such that a second channel is formed between the first RTB and the second RTB, wherein the first RTB is configured to communicatively couple with a second plurality of cables and the second channel is configured to guide the second plurality of cables away from the second RTB to the edge of the electronic module; and
a bottom housing configured to be removably attached to the top housing.

13. The electronic system of claim 12, comprising a plurality of anchors protruding from the top and bottom housings, wherein the plurality of anchors respectively align with the first and second channels to facilitate support and passage of the first and second plurality of cables over the respective anchors, wherein at least one of the plurality of anchors comprises a top portion and a bottom portion, wherein the top portion is formed on the top housing and the bottom portion is formed on the bottom housing.

14. The electronic system of claim 12, comprising a controller module communicatively coupled to the electronic module, wherein the controller module includes a processor.

15. The electronic system of claim 12, comprising a plurality of anchors respectively aligned with the first and second channels to facilitate support of the first and second plurality of cables over the respective anchors, wherein each of the plurality of anchors comprises a wedge guide configured to guide a cable tie through a space formed between the corresponding anchor and the top housing.

16. The electronic system of claim 12, comprising a plurality of light guides disposed within the ridge and configured to provide status indications of the system.

17. A method, comprising:
receiving a removable terminal block (RTB) into a receptacle of a top housing of an electronic module such that a channel is formed between a ridge of the top housing and a raised side of the RTB, wherein the channel is formed over a lower side of the RTB;
receiving a distal end of a cable into an attachment feature of the RTB; and
retaining the cable and guiding the cable away from the electronic module via the channel.

18. The method of claim 17, wherein the channel guides the cable over an anchor extending from the electronic module.

19. The method of claim 18, comprising holding the cable to the anchor via a cable tie extending around the cable and the anchor.

20. The method of claim 19, comprising receiving the cable tie on one side of the anchor over a wedge guide such that the wedge guide directs the cable tie under the anchor and up on the opposite side of the anchor.

21. The method of claim 19, comprising retaining the top housing with a bottom housing such that electronic components are enclosed within the top and bottom housings.

* * * * *